(12) United States Patent
Ho et al.

(10) Patent No.: US 6,507,104 B2
(45) Date of Patent: Jan. 14, 2003

(54) SEMICONDUCTOR PACKAGE WITH EMBEDDED HEAT-DISSIPATING DEVICE

(75) Inventors: Tzong Da Ho, Taichung (TW); Chien Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/905,754

(22) Filed: Jul. 14, 2001

(65) Prior Publication Data

US 2002/0163075 A1 Nov. 7, 2002

(30) Foreign Application Priority Data

| Sep. 7, 2000 | (TW) | ................................. 89118298 A |
| Apr. 12, 2001 | (TW) | ................................. 90108743 A |
| May 3, 2001 | (TW) | ................................. 090110578 A |

(51) Int. Cl.⁷ .................... H01L 23/34; H01L 23/10; H01L 23/48; H01L 23/52; H01L 23/02
(52) U.S. Cl. ............. 257/712; 257/737; 257/738; 257/778; 257/787; 257/710; 257/704; 257/713; 257/692; 257/695; 257/709; 257/786
(58) Field of Search ............... 257/712, 713, 257/704, 700, 710, 709, 675, 737, 738, 777, 778, 784, 786, 787

(56) References Cited

U.S. PATENT DOCUMENTS

| 5,522,667 A | * | 6/1996 | Miyake | 384/492 |
| 5,619,070 A | * | 4/1997 | Kozono | 257/692 |
| 5,726,079 A | | 3/1998 | Johnson | 438/106 |
| 5,920,120 A | * | 7/1999 | Webb et al. | 257/778 |
| 5,939,783 A | * | 8/1999 | Laine et al. | 257/778 |
| 5,977,626 A | | 11/1999 | Wang et al. | 257/707 |
| 6,117,705 A | * | 9/2000 | Glenn et al. | 438/106 |
| 6,150,724 A | * | 11/2000 | Wenzel et al. | 257/777 |
| 6,191,360 B1 | * | 2/2001 | Tao et al. | 257/778 |
| 6,218,730 B1 | * | 4/2001 | Toy et al. | 257/704 |
| 6,255,143 B1 | * | 7/2001 | Briar | 438/127 |
| 6,265,771 B1 | * | 7/2001 | Ference et al. | 257/706 |
| 6,271,058 B1 | * | 8/2001 | Yoshida | 257/718 |

* cited by examiner

Primary Examiner—Alexander O. Williams
(74) Attorney, Agent, or Firm—Peter F. Corless; Steven M. Jensen; Edwards & Angell, LLP

(57) ABSTRACT

A semiconductor package with an embedded heat-dissipating device is proposed. The heat-dissipating device including a heat sink and a plurality of connecting bumps attached to connecting pads formed on the heat sink is mounted on a substrate by reflowing the connecting bumps to ball pads of the substrate. The connecting bumps and the ball pads help buffer a clamping force generated during the molding process, so as to prevent a packaged semiconductor chip from being cracked. Moreover, the reflowing process allows the connecting bumps to be self-aligned on the substrate, so as to assure the toning and planarity of the heat sink mounted thereon. Accordingly, during molding, the precisely-positioned beat sink can have its upper side closely abutting an upper mold, allowing a molding resin to be prevented from flashing on the upper side thereof i.e. an exposed side of the heat sink to the atmosphere, so that the heat-dissipating efficiency is increase and the semiconductor package is more cost-effective to fabricate.

11 Claims, 5 Drawing Sheets

US 6,507,104 B2

SEMICONDUCTOR PACKAGE WITH EMBEDDED HEAT-DISSIPATING DEVICE

FIELD OF THE INVENTION

The present invention relates to semiconductor packages, and more particularly, to a semiconductor package with an embedded heat-dissipating device.

BACKGROUND OF THE INVENTION

A BGA (Ball Grid Array) semiconductor pace is the mainstream of semiconductor packaging technology due to relatively more I/O connections provided therewith in accordance with densely-packaged electronic components and electronic circuits therein. However, heat generated during the operation of a packaged semiconductor chip increases accordingly with increasing the packaging density of the electronic components and electronic circuits; as a result, if the heat is not efficiently dissipated, functions and the lifetime of the semiconductor package will be detrimentally affected. Moreover, a conventional BGA semiconductor package has the semiconductor chip encapsulated by an encapsulant, which is formed by an encapsulating resin with a low coefficient of thermal conductivity around 0.8 w/m°K so that the heat-dissipating efficiency of the semiconductor chip with the electronic components and electronic circuits provided on an active surface thereof is sufficiently low Therefore, to efficiently dissipate the heat generated by the semiconductor chip is an urgent problem to solve Referring to FIG. 1, a FCBGA (Flip Chip Ball Grid Array) semiconductor package 1 is disclosed in the U.S. Pat. No. 5,726,079, which is characterized by disposing a heat sink 10 above a semiconductor chip 11 with an upper surface 100 of the heat sink 10 being exposed out of an encapsulant 12, allowing the heat generated by the chip 11 to be dissipated to e atmosphere through the heat sink 10. However, a drawback has been found as the difficulty in precisely controlling the positioning and height of the heat sink 10 disposed relative tote semiconductor chip 11. During the mold molding process, if the heat sink 10 is positioned too high, it may be compressed by the coupling of molds (not shown), which further may compress the semiconductor chip 11 below the heat sink 10 and cause damage to the chip 11; if the heat sink 10 is positioned too low, a molding resin may easily flash on the upper surface 100 thereof, so that the heat-dissipating area of the semiconductor package 1 is reduced and the heat-dissipating efficiency is degraded. As a result, high preciseness in manufacture is required for positioning the heat sink 10 within the semiconductor package 1, which increases the complexity of the manufacturing process and is cost-ineffective.

Furthermore, referring to FIG. 2, another semiconductor package 2 is proposed in the U.S. Pat. No. 5,977,626. The semiconductor package 2 comprises a heat sink 20 attached to a substrate 21, wherein the substrate 21 has a semiconductor chip 2 mounted thereon. The heat sink 20 has a flat portion 200 and supporting portions 201, wherein the supporting portions 201 are used to support the flat portion 200 to be positioned above the semiconductor chip 22. A cavity 23 formed on the substrate 21 and encompassed by the flat portion 200 and the supporting portions 201 is used to receive the semiconductor chip 22 and gold wires 24 therein. Additionally, the supporting portions 201 are formed with a plurality of protrusions 202 thereon, allowing the heat sink 20 to be strongly fixed to the substrate 21 by means of the protrusions 202.

Although the foregoing semiconductor package 2 improves the heat-dissipating efficiency by the application of the heat sink 20 with a specially-designed structure as shown in FIG. 2, a drawback of the difficulty in precisely positioning the heat sink 20 on the substrate 21 has also been considered. Moreover, a stamping process is required to form the downwardly-bent supporting portions 201 of the heat sink 20, which increases the manufacturing cost and may degrade the planarity of the flat portion 200, allowing the molding resin to flash on an upper surface 2000 of the flat portion 200 (i.e. an exposed surface of the heat sink 20 to the atmosphere) In addition, the heat sink 20 is usually fabricated to be as thin as 0.2 mm or even thinner, and the strength thereof is accordingly reduced, so that the planarity of the flat portion 200 is even more difficult to assure, and the resin flash can not be eliminated.

SUMMARY OF THE INVENTION

It is an objective of the present invention to provide a semiconductor package with an embedded heat-dissipating device which helps prevent a semiconductor chip mounted therein from being cracked during the molding process.

It is another objective of the invention to provide a semiconductor package with an embedded heat-dissipating device which assures the positioning and planarity of a heat sink mounted therein.

It is sill another objective of the invention to provide a semiconductor or package with an embedded heat-dissipating device which helps prevent resin from flashing on an exposed side of the heat sink mounted therein so as to increase the heat-dissipating efficiency thereof It is yet another objective of the invention to provide a semiconductor package with an embedded heat-dissipating device which is more cost-effective to fabricate by using simplified processed.

In accordance with the going and other objectives of the invention, a semiconductor package with an embedded heat-dissipating device is proposed. The semiconductor package of the invention includes a substrate having a first side and a second side, the first side thereof being formed with a set of first solder pads and a set of second solder and the second side of being formed with a plurality of third solder pads; a semiconductor chip having an active side and an inactive side, the active side thereof being mounted with a plurality of solder bumps, which allow to electrically connect the semiconductor chip to the first solder pads of the substrate; a heat-dissipating device including a heat sink and a plurality of connecting bumps, the having sink having a fist side and a second side, the second side thereof being formed with a plurality of connecting pads, which are used to attach the connecting bumps thereto, and the connecting bumps being further attached to the second solder pads of the substrate; a plurality of conductive elements attached to the third solder pads of the substrate, allowing to electrically couple the semiconductor chip with external devices, and an encapsulant encapsulating the semiconductor or chip, the heat-dissipating device and the first side of the substrate, with the first side of the heat sink being exposed to the atmosphere.

The heat-dissipating device is implemented by attaching the connecting bumps to the connecting pads of the heat sink wherein the connecting pads are formed as recesses on the second side of the heat sink, or as holes penetrating from the firs side to the second side thereof, and the connecting bumps are made of a soft metal selected from a group consisting of tin, lead and tin/lead alloy During molding the heat-dissipating device and the solder bumps mounted on the semiconductor chip are reflowed over the substrate in a manner that the distance between the heat sink and the substrate is slightly larger than that between an upper mold and the substrate. When the upper mold and a lower mold are coupled, the clamping force generated thereby is collapsed by the effect of the soft connecting bumps, so as to reduce the pressure applied to the semiconductor chip and assure the planarity of the heat sink by abutting the heat sink the semiconductor chip.

Furthermore, besides that the connecting pads help buffer and release the pressure generated during the collapsing effect of the connecting bumps, the heat sink can be precisely positioned with respect to the substrate by reflowing the connecting bumps over the substrate; during molding, the first side of the heat can closely abut against the upper mold so as to help prevent resin from flashing on the first side of the heat sink.

BRIEF DESCRIPTION OF THE DRAWINGS

The invention can be more fully understood by reading the following detailed description of the preferred embodiment, with reference made to the accompanying drawings, wherein.

DETAILED DESCRIPTION OF THE PREFERRED EMBODIMENT

Fit Preferred Embodiment

Figure 1:
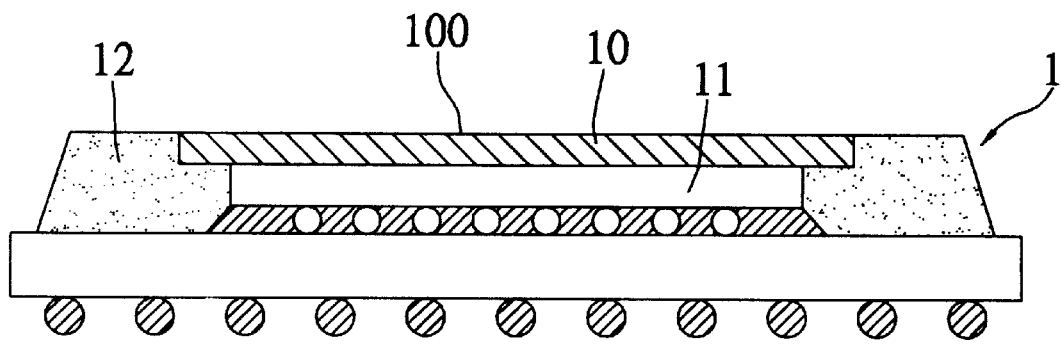
FIG. 1 (PRIOR ART) is a cross-sectional view of a semiconductor package disclosed in U.S. Pat. No. 5,726,079.
Figure 2:
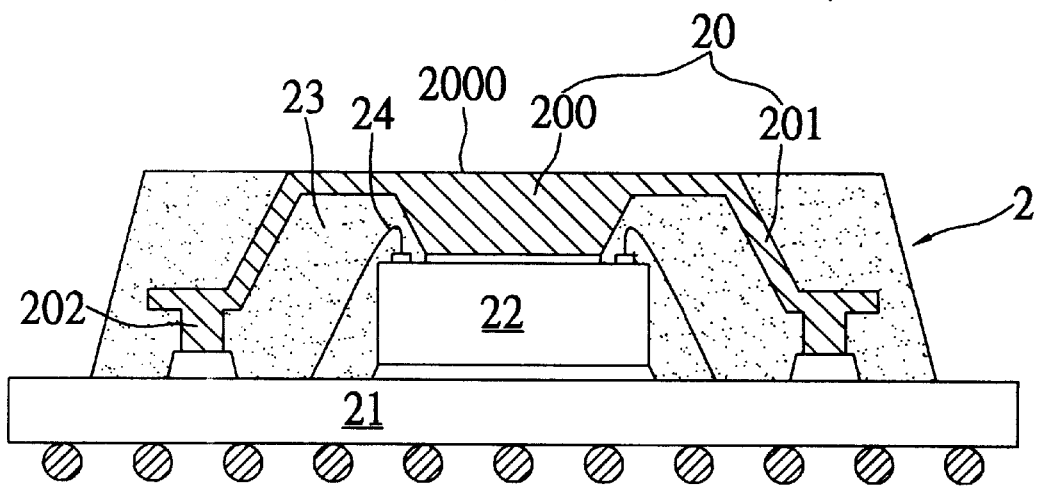
FIG. 2 (PRIOR ART) is a cross-sectional view of a semiconductor package disclosed in U.S. Pat. No. 5,977,626.
Figure 3:
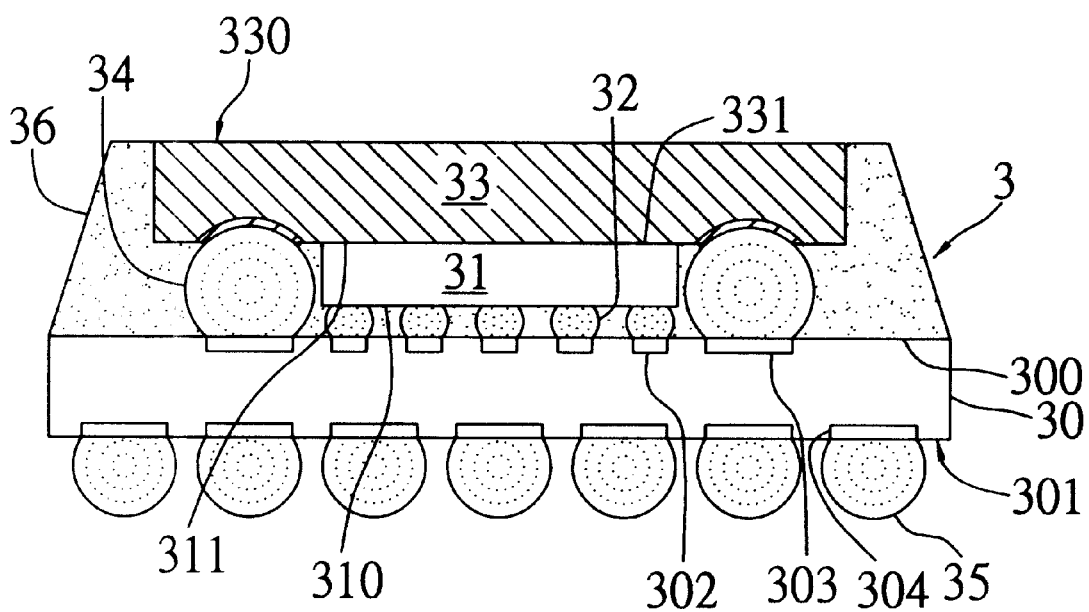
FIG. 3 is a cross-sectional view of the semiconductor package of the first preferred embodiment of the invention.

FIG. 3 illustrates the semiconductor package 3 of the first preferred embodiment of the invention. The semiconductor package 3 includes a substrate 30 having a first side 300 and a second side 301, with a plurality of solder pads 302, 303, 304 formed on the sides thereof; thereof; a semiconductor chip 31 having an active side 310 and an inactive side 311, with a plurality of solder bumps 32 (solder balls as shown in the drawing) mounted on the active side 310 thereof; a heat sink 33 having a first side 330 and a second side 331, with a plurality of connecting bumps 34 (solder balls as shown in the drawing) attached to the second side 331 thereof; a plurality of solder balls 35 mounted on th second se 301 of the substrate 30, allowing to electrically connect the semiconductor chip 31 to external devices; and an encapsulant 36 encapsulating the semiconductor chip 31 and the heat sink 33, with the first side 330 of the heat sin 33 exposed to the atmosphere.

FIGS. 4A–4D illustrate the steps involved in the manufacture of the semiconductor package 3 of the first preferred embodiment of the invention.

Figure 4A:
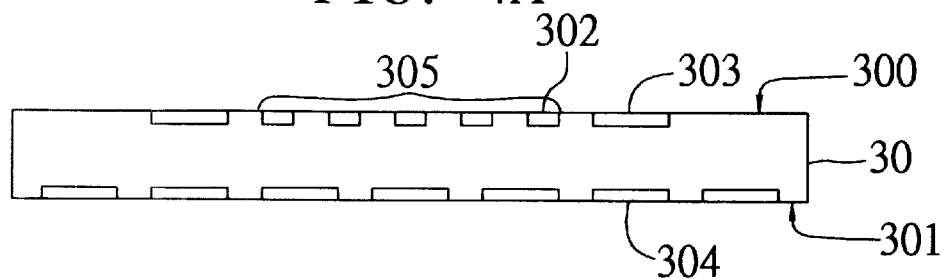
FIGS. 4A–4D are schematic cross-sectional diagrams showing the steps involved in the manufacture a of the semiconductor package of the first preferred embodiment of the invention.

First, re g to FIG. 4A, a substrate 30 having a first side 300 and a second side 301 is provided, a set of bonding pads 302 and a set of ball pads 303 are formed on the first side 300 thereof, and a plurality of conductive pads 304 are formed on the second side 301 thereof. A chip mount area 305 defined by the distribution of the bonding pads 302 is used to mount a semiconductor chip (not shown) by means of solder bumps (not shown) on the first side 300 of the substrate 30; the bonding pads 302 are electrically connected by conductive traces (not shown) through conductive vias (not shown) of the substrate 30 to the conductive pads 304 on the second side 301 of the substrate 30. The ball pads 303 formed outside the chip-mounting area 305 are used to mount a heat-dissipating device (not shown) by means of connecting bumps (not shown) on the first side 300 of the substrate 30; furthermore, the ball pads 303 have a grounding function, so as to help increase the heat-dissipating efficiency and electrical characteristics of the semiconductor package 3.

Figure 4B:
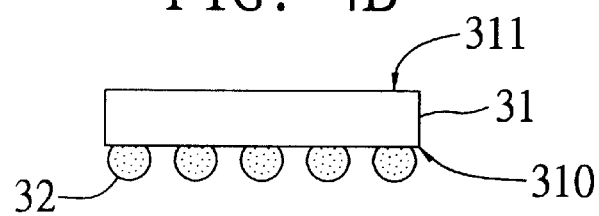

Referring to FIG. 4B, a semiconductor chip 31 having an active side 310 and an inactive side 311 is provided. A plurality of solder bumps 32 (solder balls as shown in the drawing) attained to the active side 310 of the semiconductor chip 31 allow the chip 31 to be electrically coupled with the substrate 30 (as shown in FIG. 4A) by a conventional technique of under bump metallization for a FCBGA semiconductor package.

Figure 4C:
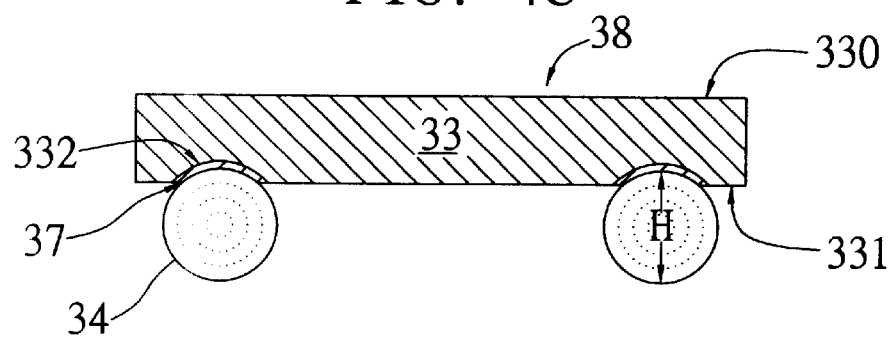

Further, referring to FIG. 4C, a heat sink 33 made of copper or aluminum is provided. The heat sink 33 has a first side 330 and a second side 331, with a plurality of connecting pads 332 (recesses as shown in the drawing) formed on the second side 331 thereof by conventional techniques as half-etching or stamping; then an adhesive 37 (eg. epoxy) is applied thereto. Moreover, a plurality of connecting bumps 34 (solder balls as shown in the drawing) are strongly attached to the connecting pads 332 of the heat sink 33 by means of the adhesive 37, so that a heat-dissipating device 38 is implemented. In addition, the connecting bumps 34 have a vertical height H greater than or equal to the sum of the thickness of the semiconductor chip 31 and the height of the solder bumps 32 (as shown in FIG. 413); the connecting bumps 34 are made of a soft metal, e.g. tin, lead, tin/lead alloy.

Figure 4D:
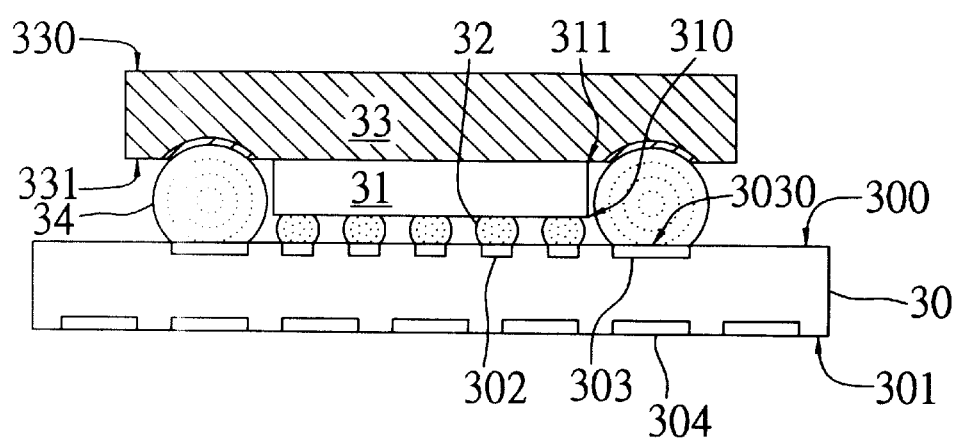

Referring to FIG. 4D, the semiconductor chip 31 and the heat sink 33 are respectively positioned on the substrate 30 by simultaneously reflowing the solder bumps 32 and the connecting bumps 34 over the corresponding solder pads 302, 303 of the substrate. During reflow, the connecting bumps 34 are self-aligned to be precisely positioned on the substrate 30 and attached to the ball pads 303. Moreover, the height of the heat-dissipating device 38 relative to the substrate 30 is adjustable according to the dimensions of the ball pads 303; if the ball pads 303 have relatively larger opening 3030, the connecting bumps 34 can be compressed in a greater extent, so that the height of the heat-dissipating device 38 is reduced.

Figure 5A:
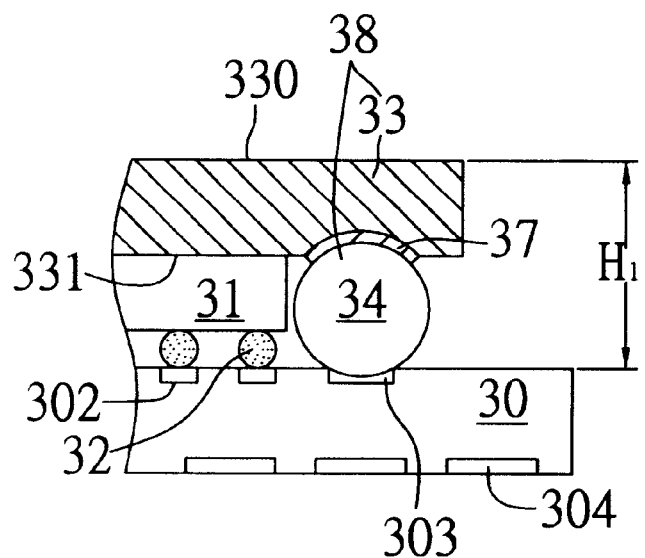
FIG. 5A is a cross-sectional diagram showing the semiconductor package of the invention prior to the molding process.
Figure 5B:
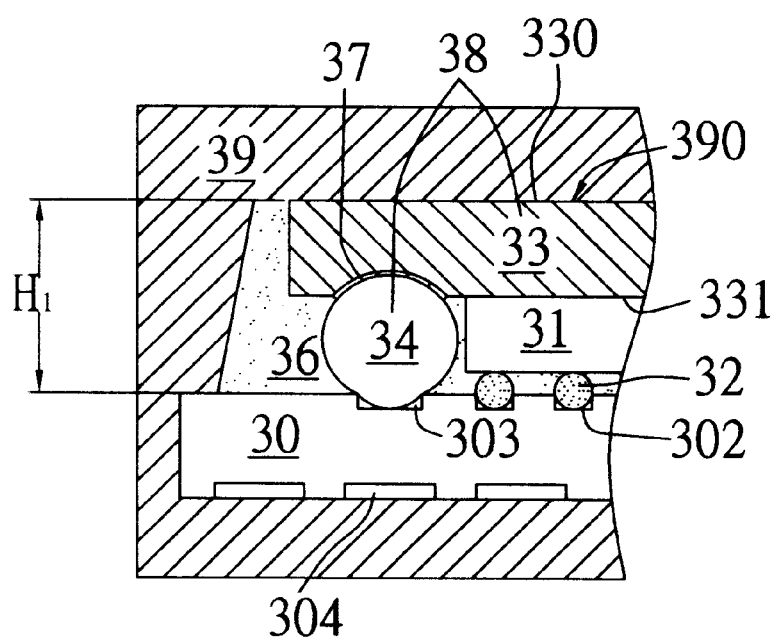
FIG. 5B is a cross-sectional diagram showing the semiconductor package of the invention during the molding process.

FIG 5A shows the semiconductor package 3 of the invention prior to the molding process, FIG. 5B shows the semiconductor package 3, of the invention during the molding process.

After the foregoing reflowing process completed, referring to FIG. 5B, the molding process is proceeded to form a first encapsulant 36 by using a conventional resin compound e.g. epoxy resin. The encapsulant 36 is used to encapsulate the semiconductor chip 31, the solder bumps 32 and the heat-dissipating device 38, with the first side 330 of the heat sink 33 being exposed the atmosphere Referring to FIG. 5A, since the connecting bumps 34 are made of a soft metal, and the adhesive 37 used to connect the connecting bumps 34 and the heat sink 33 is a buffer to be able to absorb pressure, the height $H_1$ of the heat-dissipating device 38 relative to the first side 300 of the substrate 30 is set to be slightly larger than the distance between a top side 390 of an encapsulating mold 39 and the first side 300 of the substrate 30. During molding, referring to FIG. 5B, the connecting bumps 34 are compressed to deform by a clamping force downwardly generated from the top side 390 of the mold 39, allowing the first side 330 of the heat sink 33 to closely abut against the top side 390 of the mold 39, so as to help prevent the resin from flashing over the first side 330 of the heat sink 33, and assure the heat-dissipating efficiency and appearance of the semiconductor package. Moreover, the buffering effect of the connecting bumps 34 and the adhesive 37 helps collapse the clamping force from the mold 39, so as to help prevent the semiconductor chip 31 from being cracked during molding.

Second Preferred Embodiment

Figure 6:
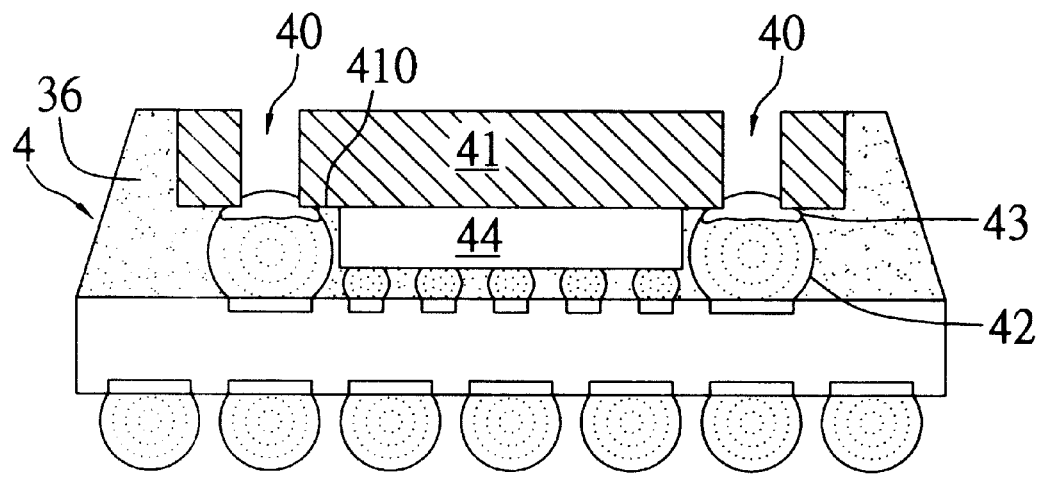
FIG. 6 is a cross-sectional view of the semiconductor package of the second preferred embodiment of the invention.

FIG. 6 illustrates the semiconductor package 4 of the second preferred embodiment of the invention. The semiconductor package 4 differs from the package disclosed in the first preferred embodiment in that a plurality of holes 40, instead of 332 (as shown in FIG. 3), are formed to penetrate a heat sink 41 by a conventional punching technique and used attach connecting bumps 42 (solder balls as shown in the drawing) thereto by applying an adhesive 43 to openings thereof on a second side 410 of the heat sink 41. When molds are coupled during molding (not shown), a clamping force generated by the molds and applied to the heat sink 41 deforms the connecting bumps 42, and the holes 40 act as a buffer to help release the clamping force, so as to reduce the clamping pressure on the semiconductor chip 44, so that the semiconductor chip 44 is protected.

Third Preferred Embodiment

Figure 7:
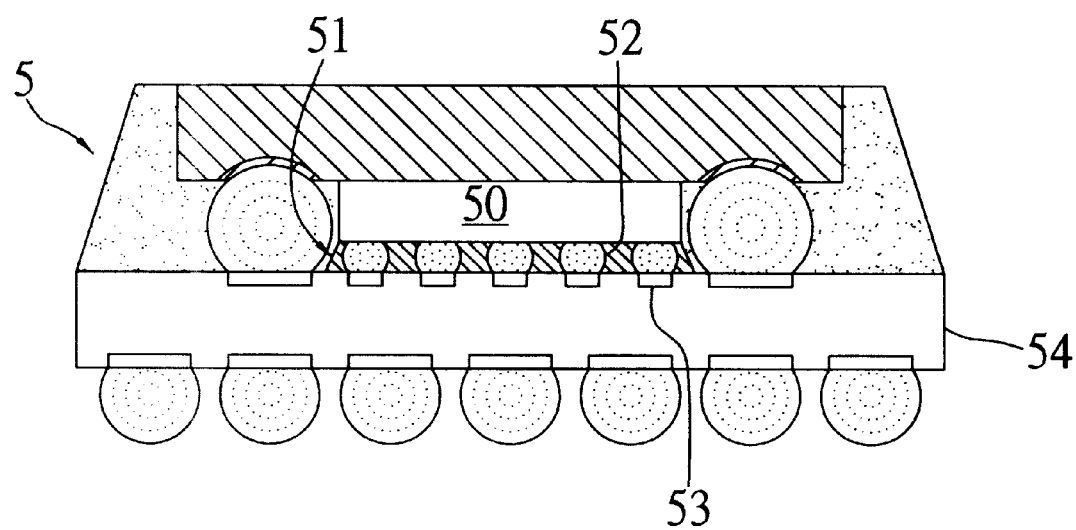
FIG. 7 is a cross-sectional view of the semiconductor package of the third preferred embodiment of the invention.

FIG. 7 illustrates the semiconductor package 5 of the third preferred of the invention. The semiconductor package 5 differs from the packages disclosed in the first and second preferred embodiments only in that a semiconductor chip 50 is underfilled by using a conventional resin compound to form an encapsulant 51 which encapsulates solder bumps 52, after the reflowing of the solder bumps 52 over bonding pads 53 of a substrate 54 is completed As such, the encapsulant 51 provides protection for the attachment solder bumps 52 and the bonding pads 53 from being damaged by a clamping force generated by the coupling of molds (not shown) during molding, so as to assure the quality of soldering the semiconductor chip 50 on the substrate 54.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, which comprises:
    a substrate having a first side and a second side, the first side thereof being formed with a set of first solder pads and a set of second solder pads, and the second side thereof being formed with a plurality of third solder pads;
    a semiconductor chip having an active side and an inactive side, the active side thereof being mounted with a plurality of solder bumps, which allow the semiconductor chip to be electrically connected to the first solder pads of the substrate;
    a heat-dissipating device including a heat sink and a plurality of connecting bumps, the heat sink having a first side and a second side, the second side thereof being formed with a plurality of recessed portions, wherein the connecting bumps are adhered to the recessed portions of the heat sink and further attached to the second solder pads of the substrate, allowing the connecting bumps to be interposed between the heat sink and the substrate, and wherein the connecting bumps are dimensioned larger in vertical height than the sum of the thickness of the semiconductor chip and the height of the solder bumps;
    a plurality of conductive elements attached to the third solder pads of the substrate, allowing the semiconductor chip to be electrically connected to external devices; and
    a first encapsulant encapsulating the semiconductor chip, the heat-dissipating device and the first side of the substrate, with the first side of the heat sink being exposed to the atmosphere.

2. The semiconductor package of claim 1, wherein the second solder pads have openings being dimensioned in accordance with the distance between the heat sink and the first side of the substrate.

3. The semiconductor package of claim 1, which further comprises:
    a second encapsulant encapsulating the solder bumps disposed between the semiconductor chip and the substrate.

4. The semiconductor package of claim 1, wherein the heat sink is made of a conductive metal.

5. The semiconductor package of claim 1, wherein the connecting bumps are made of a material selected from a group consisting of tin, lead and tin/lead alloy.

6. The semiconductor package of claim 1, wherein the connecting bumps are adhered to the recessed portions of the heat sink by means of an adhesive.

7. The semiconductor package of claim 6, wherein the adhesive is epoxy.

8. The semiconductor package of claim 1, wherein the solder bumps and the connecting bumps are reflowed over the solder pads of the substrate.

9. The semiconductor package of claim 1, wherein the conductive elements are solder balls.

10. A semiconductor package, which comprises:
    a substrate having a first side and a second side, the first side thereof being formed with a set of first solder pads and a set of second solder pads, and the second side thereof being formed with a plurality of third solder pads;
    a semiconductor chip having an active side and an inactive side, the active side thereof being mounted with a plurality of solder bumps, which allow the semiconductor chip to be electrically connected to the first solder pads of the substrate;

a heat-dissipating device including a heat sink and a plurality of connecting bumps, the heat sink having a first side and a second side, the second side thereof being formed with a plurality of through holes penetrating through the heat sink, wherein the connecting bumps are adhered to the through holes on the second side of the heat sink and further attached to the second solder pads of the substrate, allowing the connecting bumps to be interposed between the heat sink and the substrate, and wherein the connecting bumps are dimensioned larger in vertical height than the sum of the thickness of the semiconductor chip and the height of the solder bumps;

a plurality of conductive elements attached to the third solder pads of the substrate, allowing the semiconductor chip to be electrically connected to external devices; and a first encapsulant encapsulating the semiconductor chip, the heat-dissipating device and the first side of the substrate, with the first side of the heat sink being exposed to the atmosphere.

11. The semiconductor package of claim 10, wherein the connecting bumps are adhered to the through holes of the heat sink by means of an adhesive.

* * * * *